United States Patent
Wang

(10) Patent No.: US 7,110,308 B2
(45) Date of Patent: Sep. 19, 2006

(54) SELF-LATCHED CONTROL CIRCUIT FOR MEMORY PROGRAM OPERATION

(75) Inventor: Chien-Fan Wang, Hsing Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 82 days.

(21) Appl. No.: 11/021,117

(22) Filed: Dec. 22, 2004

(65) Prior Publication Data

US 2006/0133162 A1    Jun. 22, 2006

(51) Int. Cl.
    *G11C 7/00*    (2006.01)
(52) U.S. Cl. .................... 365/189.11; 365/189.05; 365/189.09
(58) Field of Classification Search ........... 365/189.11, 365/189.05, 189.09, 204
    See application file for complete search history.

(56) References Cited

U.S. PATENT DOCUMENTS

| | | | | |
|---|---|---|---|---|
| 5,541,883 A | * | 7/1996 | Devanney | 365/201 |
| 5,768,206 A | * | 6/1998 | McClure | 365/225.7 |
| 6,249,462 B1 | * | 6/2001 | Tanaka et al. | 365/189.05 |
| 6,304,495 B1 | * | 10/2001 | Kim et al. | 365/189.11 |

* cited by examiner

*Primary Examiner*—Richard Elms
*Assistant Examiner*—Toan Le
(74) *Attorney, Agent, or Firm*—Duane Morris LLP

(57) ABSTRACT

A memory programming control circuit is disclosed. The memory programming control circuit is connected to a memory cell via a data line for controlling a programming current in a programming operation of the memory cell. The memory programming control circuit includes a programming enable device connected to a positive power supply for selectively applying a pull-up current on the data line; and a self-latch module connected between the programming enable device and the memory cell for preventing the pull-up current from flowing to the memory cell through the data line, when the memory cell is programmed with a predetermined data bit.

24 Claims, 2 Drawing Sheets

SELF-LATCHED CONTROL CIRCUIT FOR MEMORY PROGRAM OPERATION

BACKGROUND

The present disclosure relates generally to memory circuits, and more particularly, to a control circuit for performing inhibit operations during the writing of a memory cell by implementing pre-defined biased controls and self-latch features.

In the new age of technology, flash memory has turned into one of the most popular read-only memory (ROM) available in the market mainly because of its capability of allowing easy and fast permanent data storage for devices such as computers, digital cameras, and many other portable devices. While other storage methods such as hard drive and random-access memory (RAM) are still used, flash memory remains as a competitive choice. Flash memory is considered a solid state device that provides users with a quicker and more reliable way of storage. Flash memory also allows users to write data into the memory cells permanently—a feature that the random-access memory (RAM) does not provide.

However, with all these advantages, flash memory still has its tradeoffs. The writing of data to flash memory can be a long process, since the process typically requires a much higher voltage and current than the writing process of random-access memory (RAM). In order to write to flash memory cells, source lines are biased with high voltage, and the selected memory cell must reach the effective program current, which would be the difference between the biased pull-down NMOS current and controlled pull-up PMOS current that charges the bit lines. However, a leakage current can occur after each programming and erasing cycle while the current travels through the bit lines, thereby lowering the effective program current that is needed to write to the memory cells. One conventional method to solve this problem is to simply make the controlled pull-up PMOS current large enough so the leakage current would not affect the writing process. However, by increasing the controlled pull-up PMOS current, controlling the effective program current within in a certain range required for the memory cells becomes difficult.

Desirable in the art of memory modules, such as flash memory, are additional designs that solve current leakage issues while providing better control over the effective program current during the writing process.

SUMMARY

This invention discloses a memory programming control circuit, which is connected to a memory cell via a data line for controlling a programming current in a process of programming a binary datum to the memory cell.

In one embodiment, the memory programming control circuit includes a programming enable device connected to a positive power supply for selectively applying a pull-up current on the data line; and a self-latch module connected between the programming enable device and the memory cell for preventing current leakage caused by the pull-up current, thereby providing a predetermined program current of the memory cell when a program data is provided. The programming enable device is connected between a positive power supply and the memory cell via the data line for selectively applying a pull-up current on the data line. The self-latch module is connected between the programming enable device and the memory cell via the data line for selectively preventing the pull-up current from applying onto the data line in response to a current drain on the same.

The construction and method of operation of the invention, however, together with additional objects and advantages thereof will be best understood from the following descriptions of specific embodiments when read in connection with the accompanying figures.

DESCRIPTION

The present invention provides a programming control circuit for a memory module, such as ROM, RAM and flash memory, to perform a programming or inhibiting process of a memory cell. This invention implements a self-latch system to a memory module to provide a solution for leakage current on data lines. The programming control circuit also provides a good control for an effective programming current that is needed for the programming process. By applying this invention, the programming process for a memory module is improved and easily controlled. By implementing a latch-type pull-up device and setting a pre-defined bias current to easily tune the trigger points, leakage current of bit lines can be pre-defined such that it will no longer affect the effective program current. To improve access time, bit line boost is also possible, since this system makes it easy to separate the normal read path and program write path. Note that while the following embodiment is described based on a flash memory cell, the invention is applicable to any kind of memory cells without deviating from its spirit.

Figure 1:
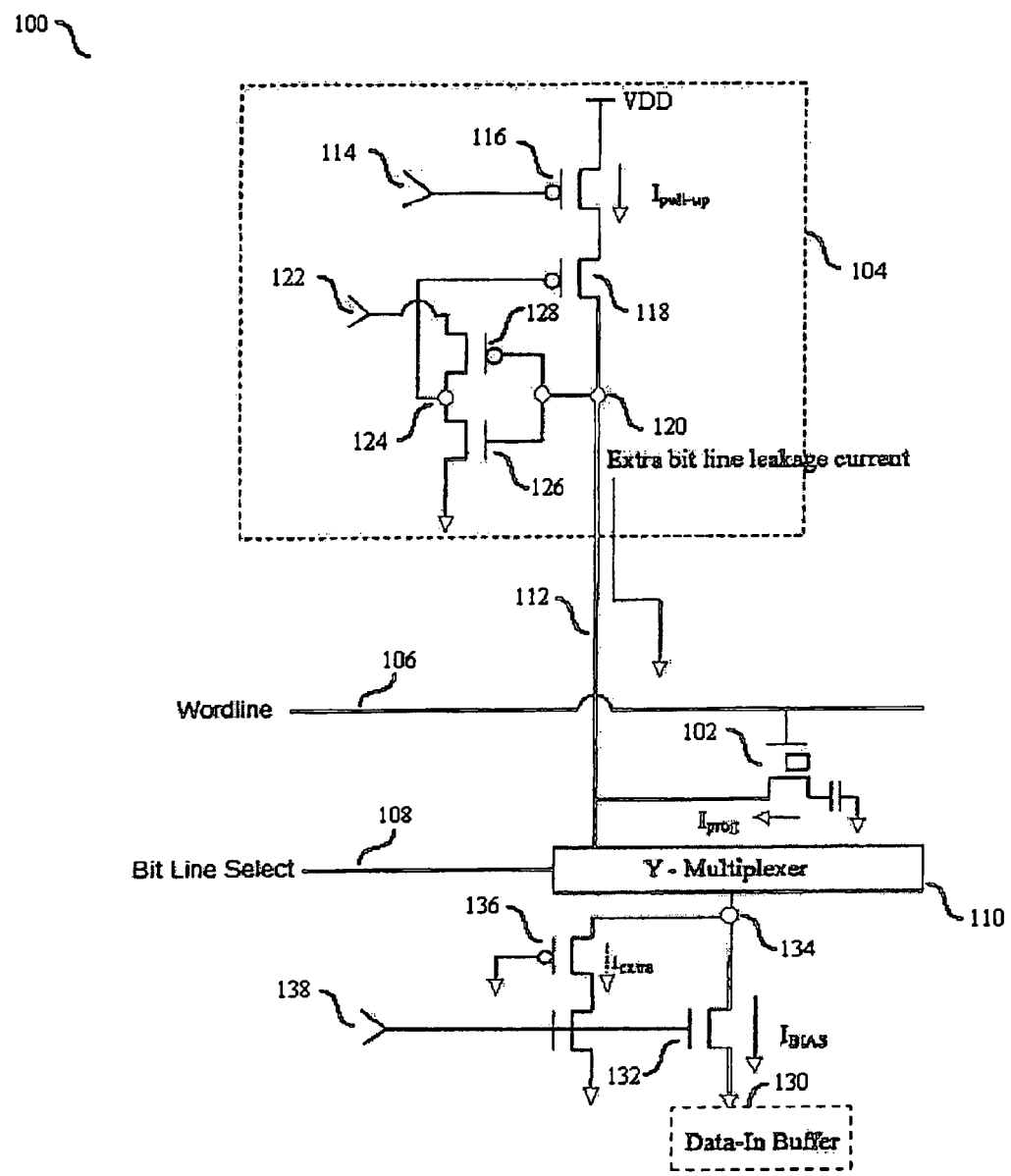
FIG. 1 illustrates a programming control circuit utilizing a self-latch module, in accordance with one embodiment of the present invention.

FIG. 1 illustrates a programming control circuit 100 utilizing a self-latch system 104 for inhibiting or programming a flash memory cell 102 in accordance with one embodiment of the present invention. The programming control circuit 100 includes a memory cell 102, a self-latch system 104, and a data-in buffer 130.

In conventional designs, it is necessary to pull the bit-line voltage high to inhibit programming unselected bit-lines. A pull-up PMOS transistor is utilized to charge bit-lines without decoding. The effective programming current $I_{prog}$ required for writing in a memory cell is the difference between the bias current $I_{BIAS}$ and the pull-up current $I_{pull-up}$ ($I_{prog}=I_{BIAS}-I_{pull-up}$). However, the bit-line has some unexpected leakage current that can cause the bias current on the bit line to be pulled down, resulting in an insufficient effective programming current $I_{prog}$. Solutions, such as increasing the pull-up current, exist, but the increase in pull-up current may affect the control of effective programming current $I_{prog}$. In this embodiment, the self-latch system 104 and data-in buffer 130 are utilized to provide a solution to the leakage current issue, without affecting the control of the effective programming current.

The self-latch system 104 includes a programming enable device 116, such as a PMOS transistor, connected between a positive power supply and a self-latch module, collectively represented by PMOS transistors 118 and 128 and an NMOS transistor 126. The gate terminal of the PMOS transistor 128 is connected to a data line 112, such as a bit line, and its drain electrode is connected to the gate terminal of the PMOS transistor 118. The source electrode of the PMOS transistor 128 receives a programming mode signal for selectively setting the self-latch module in a programming mode or non-programming mode. The gate terminal of the NMOS transistor 126 is connected to the data line 112, and its source electrode is connected to ground. The drain electrode of the NMOS transistor 126 is connected to the drain electrode of the PMOS transistor 128, and further connected to the gate terminal of the PMOS transistor 118.

The self-latch system 104 is connected to the memory cell 102, and further connected to the data-in buffer 130 via a bit line selection multiplexer, such as a Y-multiplexer 110. The data-in buffer 130 includes a PMOS transistor 132, whose gate terminal is controlled by a bias control signal 138, and source electrode is connected to ground. A set of PMOS transistor 136 and NMOS transistor is connected between the memory cell 102 and ground, and in parallel to the PMOS transistor 132.

Like other memory writing processes, the writing of flash memory also requires a memory address to determine which cell to modify. A word line 106 determines a row address of the cell and a bit line select 108 determines the column address of the cell. The Y-multiplexer 110 is used to determine which data line to select after taking in a selection signal from the bit line select 108. For illustration purposes, there is only one data line in FIG. 1, but the Y-multiplexer 110 can control multiple data lines. For this example, it is assumed that the Y-multiplexer 110 selects the data line 112, and the address of the memory cell that will be programmed would be word line 0 and bit line select 0. Although only one memory cell is illustrated, it is however understood by those skilled in the art that the invention may extend to multi-dimensional memory cell arrays without deviating from the spirit of the invention.

There are basically two states of operation for the circuit 100: a non-program state and a program state. In the non-program state, since no data is expected to be written in the memory cell 102, it is not necessary to have the required high effective programming current $I_{prog}$ that is needed to program a memory cell. Furthermore, in order to inhibit the programming of the memory cell 102, it is desired to keep the data line 112 at a high voltage level. As such, the bias control signal 138 in the data-in-buffer is pulled low and a node 120 is charged to a high voltage level through the Y-multiplexer 110. With the node 120 charged to high, a node 124 is set to low and PMOS transistor 118 is turned on to charge the data line 112 with the pull-up current $I_{pull-up}$. This ensures that the PMOS transistor 118 will remain on during the non-program state.

When the programming process is about to begin and the timing has been applied, the node 120 needs to be charged up to high to provide a sufficient level of effective programming current. To achieve that sufficient level, the program reference control signal 114 is biased to supply a pre-defined current through the programming enable device 116. With the programming enable device 116 on, the node 120 is pulled high to VDD. The node 124 will still remain low, thereby keeping the PMOS transistor 118 switched on even though the node 120 is high, since the NMOS transistor 126 will be pulling the node 124 to low.

During the programming state, the latch control signal 122 will be set to high by a programming mode signal. The bias for the node 120 may be different, depending on the state of the program data input. If the data being programmed is high, the node 120 will remain high since there will not be any discharging paths available. Leakage current of the data lines will not be an issue when programming a data value with a high state if this current is smaller than the pre-defined pull-up current $I_{pull-up}$, since the pre-defined pull-up current $I_{pull-up}$ is preset to be higher than the known leakage current. If the data value that is being programmed is low, the bias current $I_{BIAS}$ would flow through the NMOS transistor 132 to discharge a node 134. The node 134 will start discharging extra current $I_{extra}$ once the voltage level at the node 134 is high enough to turn on the PMOS transistor 136. The node 120 is drained and will follow the node 134 by being pulled down to low. Once the node 120 is low enough, the PMOS transistor 128 turns on, thereby allowing the high voltage programming mode signal at the latch control signal 122 to flip the node 124 to a high state, thereby turning off the PMOS transistor 118. When the PMOS transistor 118 is off, $I_{pull-up}$ becomes zero, thereby allowing the bias current $I_{BIAS}$ to be equal to the effective program current $I_{prog}$. As such, the effective programming current $I_{prog}$ is effectively controlled by simply adjusting the bias current $I_{BIAS}$ through a bias control signal 138.

Figure 2:
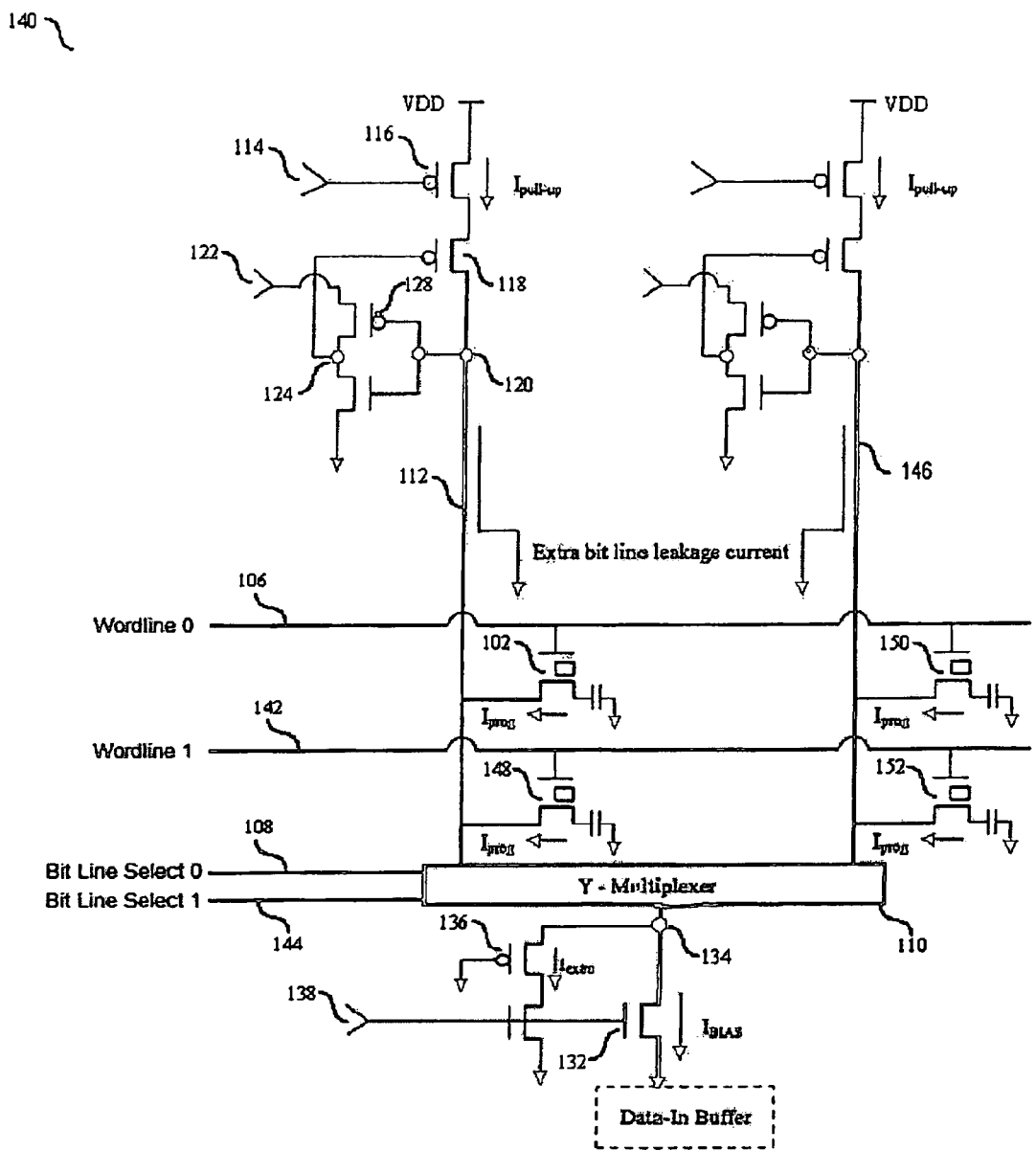
FIG. 2 illustrates a programming control circuit for a plurality of memory cells, in accordance with one embodiment of the present invention.

FIG. 2 illustrates a circuit 140 with two data lines and four memory cells in accordance with one embodiment of the present invention. The programming control circuit 140 displays a more realistic environment for a memory circuit by having multiple memory cells to choose from to perform the write operation. The wordlines 106 and 142 are used to determine which row of memory cells to choose from, and the bit line select signals 108 and 144 along with the Y-multiplexer 110 work together to determine whether to operate on the data line 112 or a data line 146. Memory address can be obtained if a particular wordline and data line select are chosen. The four memory cells available in the programming control circuit 140 are cells 102, 148, 150 and 152. In this example, the memory cell 148 at memory address of the wordline 142 and the data line select 144 will be modified.

Even with the extra memory cells, the programming control circuit 140 will operate the same way as the programming control circuit 100 in FIG. 1 once the memory cell is selected. There will still be two states during operation: the non-program state and the program state. As explained in a detailed description of FIG. 1, the non-program state will keep the node 120 high by the pull-up current $I_{pull-up}$ to make sure that the PMOS transistor 118 remains turned on during non-program state.

During the program state, the circuit 140 operates differently depending on the state of the data being programmed into the memory cell 148. If the program data value is high, the pre-defined pull-up current $I_{pull-up}$ biased by the program reference control signal 114 is preset to be higher than the known leakage current. This allows the node 120 to remain high and not be discharged by the data line leakage current, since the pull-up current is higher than the leakage current. If the program data value is low, the node 134 will pull the node 120 to low with the PMOS transistor 136 and the NMOS transistor 132 turned on. The PMOS transistor 128 will turn on as the node 120 drops to low and the latch control signal 122 is preset to a high state to turn off the PMOS transistor 118 and to stop the pull-up current $I_{pull-up}$ from being pulled down as well. The control of effective programming current becomes simple without $I_{pull-up}$ since $I_{prog}$ will equal directly to $I_{BIAS}$. By simply controlling $I_{BIAS}$ through the bias control signal 138, the effective program current will be under control as well.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory programming control circuit connected to a memory cell via a data line for controlling a programming current in a programming operation of the memory cell, the memory programming control circuit comprising:
   a programming enable device connected to a positive power supply for selectively applying a pull-up current on the data line; and
   a self-latch module connected between the programming enable device and the memory cell for preventing the pull-up current from flowing to the memory cell through the data line, when the memory cell is programmed with a predetermined data bit.

2. The memory programming control circuit of claim 1 wherein the programming enable device is a PMOS transistor with its gate controlled by a program reference control signal.

3. The memory programming control circuit of claim 2 wherein the self-latch module further comprises:
   a first PMOS transistor connected between the programming enable device and the memory cell; and
   a second PMOS transistor connected in series with a first NMOS transistor with two gates thereof coupled to a drain of the first PMOS transistor through the data line, and two drains thereof coupled to a gate of the first PMOS transistor,
   wherein a source of the second PMOS transistor receives a programming mode signal.

4. The memory programming control circuit of claim 3 wherein the programming mode signal is at a high voltage level when the memory cell is under a programming operation.

5. The memory programming control circuit of claim 4 wherein when the predetermined data bit is a logic high, the programming enable device and the first PMOS transistor of the self latch module are turned on for providing the pull-up current.

6. The memory programming control circuit of claim 4 further comprising a data-in buffer coupled to the data line through a bit line selection multiplexer for selectively discharging the data line when the predetermined data bit is a logic low.

7. The memory programming control circuit of claim 6 wherein the data-in buffer provides a bias current for discharging the data line, thereby pulling down the gates of the second PMOS and first NMOS transistors of the self-latch module which in turn turns off the first PMOS transistor with the programming mode signal, thereby preventing the pull-up current from flowing to the memory cell through the data line.

8. The memory programming control circuit of claim 6 wherein the data-in buffer further comprises a second NMOS transistor connecting the data line to ground for selectively discharging the same when the predetermined data bit is a logic low.

9. The memory programming control circuit of claim 8 wherein the data-in buffer further comprises a third PMOS transistor and a third NMOS transistor connected in series with one another, and in parallel with the second NMOS transistor for serving as a supplemental current discharging path.

10. The memory programming control circuit of claim 8 wherein the third PMOS transistor is always turned on while gates of the second and third NMOS transistors are controlled by a bias control signal.

11. A memory programming control circuit connected to a memory cell via a data line for controlling a programming current in a programming operation of the memory cell, the memory programming control circuit comprising:
    a programming enable device connected to a positive power supply for selectively applying a pull-up current on the data line;
    a self-latch module connected between the programming enable device and the memory cell for preventing the pull-up current from flowing to the memory cell through the data line, when the memory cell is programmed with a predetermined data bit; and
    a data-in buffer coupled to the data line for selectively discharging the data line when the predetermined data bit is a logic low.

12. The memory programming control circuit of claim 11 wherein the programming enable device is a PMOS transistor with its gate controlled by a program reference control signal.

13. The memory programming control circuit of claim 12 wherein the self-latch module further comprises:
    a first PMOS transistor connected between the programming enable device and the memory cell; and
    a second PMOS transistor connected in series with a first NMOS transistor with two gates thereof coupled to a drain of the first PMOS transistor through the data line, and two drains thereof coupled to a gate of the first PMOS transistor,
    wherein a source of the second PMOS transistor receives a programming mode signal.

14. The memory programming control circuit of claim 13 wherein the programming mode signal is at a high voltage level when the memory cell is under a programming operation.

15. The memory programming control circuit of claim 14 wherein when the predetermined data bit is a logic high, the programming enable device and the first PMOS transistor of the self latch module are turned on for providing the pull-up current.

16. The memory programming control circuit of claim 14 wherein the data-in buffer provides a bias current for discharging the data line, thereby pulling down the gates of the second PMOS and first NMOS transistors of the self-latch module which in turn turns off the first PMOS transistor with the programming mode signal, thereby preventing the pull-up current from flowing to the memory cell through the data line.

17. The memory programming control circuit of claim 14 wherein the data-in buffer further comprises a second NMOS transistor connecting the data line to ground for selectively discharging the same when the predetermined data bit is a logic low.

18. The memory programming control circuit of claim 17 wherein the data-in buffer further comprises a third PMOS transistor and a third NMOS transistor connected in series with one another, and in parallel with the second NMOS transistor for serving as a supplemental current discharging path.

19. The memory programming control circuit of claim 17 wherein the third PMOS transistor is always turned on while gates of the second and third NMOS transistors are controlled by a bias control signal.

20. A memory programming control circuit connected to a plurality of memory cells via a plurality of data lines for controlling at least one programming current in a program operation of the memory cells, the memory programming control circuit comprising:
   at least one bit line selection multiplexer for selecting a predetermined data line to charge a predetermined memory cell;
   a pull-up PMOS transistor connected to a positive power supply for selectively applying a pull-up current through its source and drain to the data line when a gate thereof is activated by a program reference control signal;
   a self-latch module connected between the pull-up PMOS transistor and the memory cell for preventing the pull-up current from flowing to the memory cell through the data line, when the memory cell is programmed with a predetermined data bit; and
   a data-in buffer coupled to the data line through the bit line selection multiplexer for selectively discharging the data line when the predetermined data bit is a logic low,
   wherein the self-latch module prevents the pull-up current from flowing into the predetermined data line when the data-in buffer discharges the data line.

21. The memory programming control circuit of claim 20 wherein the self-latch module further comprises:
   a first PMOS transistor connected between the pull-up PMOS transistor and the memory cell; and
   a second PMOS transistor connected in series with a first NMOS transistor with two gates thereof coupled to a drain of the first PMOS transistor through the data line, and two drains thereof coupled to a gate of the first PMOS transistor,
   wherein a source of the second PMOS transistor receives a programming mode signal.

22. The memory programming control circuit of claim 21 wherein when the predetermined data bit is a logic high, the pull-up PMOS transistor and the first PMOS transistor of the self-latch module are turned on for providing the pull-up current.

23. The memory programming control circuit of claim 22 wherein the data-in buffer provides a bias current for discharging the data line, thereby pulling down the gates of the second PMOS and first NMOS transistors of the self-latch module which in turn turns off the first PMOS transistor with the programming mode signal, thereby preventing the pull-up current from flowing to the memory cell through the data line.

24. The memory programming control circuit of claim 20 wherein the data-in buffer further comprises:
   a first NMOS transistor connecting the data line to ground for selectively discharging the same when a logic low data is being programmed into the memory cell;
   a first PMOS transistor coupled to the data line through the bit line selection multiplexer in parallel to the first NMOS transistor; and
   a second NMOS transistor connected in series between the first PMOS transistor and ground, and in parallel with the first NMOS transistor for serving as a supplemental current discharging path,
   wherein the first PMOS transistor is always turned on while gates of the first and second NMOS transistors are controlled by a bias control signal.

* * * * *